(12) United States Patent
Wei et al.

(10) Patent No.: US 8,575,034 B2
(45) Date of Patent: Nov. 5, 2013

(54) FABRICATING METHOD OF SEMICONDUCTOR ELEMENT

(75) Inventors: Ming-Te Wei, Changhua County (TW); Po-Chao Tsao, Tainan (TW); Ming-Tsung Chen, Tainan (TW)

(73) Assignee: United Microelectronics Corporation, Hsinchu (TW)

( * ) Notice: Subject to any disclaimer, the term of this patent is extended or adjusted under 35 U.S.C. 154(b) by 7 days.

(21) Appl. No.: 13/283,690

(22) Filed: Oct. 28, 2011

(65) Prior Publication Data

US 2013/0109163 A1   May 2, 2013

(51) Int. Cl.
*H01L 21/461* (2006.01)

(52) U.S. Cl.
USPC ..... 438/734; 438/735; 438/736; 257/E21.023

(58) Field of Classification Search
USPC ........... 438/735, 734, 736–737; 257/E21.023
See application file for complete search history.

(56) References Cited

U.S. PATENT DOCUMENTS

| | | | |
|---|---|---|---|
| 6,566,019 B2 | 5/2003 | Kling et al. | |
| 7,915,171 B2 | 3/2011 | Wallace et al. | |
| 2003/0077911 A1* | 4/2003 | Chang et al. | 438/725 |
| 2006/0099522 A1* | 5/2006 | Park et al. | 430/5 |
| 2007/0105391 A1* | 5/2007 | Hashimoto et al. | 438/717 |

* cited by examiner

*Primary Examiner* — Thanhha Pham
(74) *Attorney, Agent, or Firm* — WPAT, PC; Justin King

(57) ABSTRACT

The present invention relates to a fabricating method of a semiconductor element. First, a substrate is provided and a first layout structure having a first width is formed on the substrate. Then, an etching mask is formed to cover the first layout structure, and the etching mask exposes a portion of the first layout structure. After that, the first layout structure is etched with the etching mask to form a second layout structure having a second width. The second width is less than the first width. This fabricating method is capable of finishing the fabrication of gate structures in two different directions. Accordingly, the layout flexibility is improved.

10 Claims, 3 Drawing Sheets

FABRICATING METHOD OF SEMICONDUCTOR ELEMENT

FIELD OF THE INVENTION

The present invention relates generally to a fabricating method for semiconductor elements, and more particularly, relates to a fabricating method for semiconductor elements used in integrated circuits.

BACKGROUND OF THE INVENTION

FIGS. 1A and 1B are schematic top views illustrating a partial layout of an integrated circuit chip, which mainly includes an active region 10 of a metal oxide semiconductor (MOS) element and gate structures 11, 12. According to the practical layout requirements, the gate structures 11, 12 may be arranged in two different directions, for example, as shown in FIGS. 1A and 1B, respectively. Portions of the active region 10 at opposite sides of the gate structures 11, 12 are source/drain regions, while a portion that is covered by the gate structures 11, 12 is a channel region. Thus, widths of the gate structures 11 and 12 define the length of the channel regions.

According to the design of an integrated circuit, a same chip may also include MOS elements of different channel lengths to provide different circuit characteristics such as on current ($I_{on}$). Also, the width of the gate structures 11 and 12 need to be changed according to the requirements. In addition, the circuit characteristic of MOS elements can also be modified by changing the implantation conditions for forming the source/drain regions.

However, as the size of MOS elements is becoming smaller and smaller, the widths W1, W2 of the gate structures 11, 12 reach to a resolution limit of a photolithography technique. Referring to FIG. 2, to reduce the critical dimension (CD) of gate structures, a dipole exposure technique, which employs a light source 20 of a shape differing from the conventional donut shape, is developed. The light source 20 would emphasis the exposure effect, in other words, exposure resolution, in a direction indicated by an arrow 22 (i.e., a direction parallel to the y-axis); however, the exposure effect in a direction indicated by an arrow 21 (i.e., a direction perpendicular to the y-axis) attenuates simultaneously. Thus, if the light source 20 is used to perform the exposure, the CD of the gate structure 11 in the direction parallel to the y-axis in FIG. 1A can be efficiently controlled, but the width W2 of the gate structure 12 in the direction perpendicular to the y-axis would be under an expected level due to the exposure attenuation. That is, the width W2 can't reach to a required dimension. At the same time, the width of the gate structure 12 is currently required having smaller CD. Therefore, the MOS element having a channel length of smaller CD, as shown in FIG. 1B, can't be fabricated using the light source 20 in FIG. 2. This limitation of the dipole exposure technique leads to reduced flexibility of product design. Thus, there is a desire to develop a new fabricating method that is capable of overcoming aforementioned disadvantages.

SUMMARY OF THE INVENTION

The present invention provides a fabricating method of a semiconductor device which is capable of overcome aforementioned disadvantages.

In one embodiment, a fabricating method of a semiconductor element is provided. First, a substrate is provided and a first layout structure having a first width is formed on the substrate. Then, an etching mask is formed to cover the first layout structure, and the etching mask exposes a portion of the first layout structure. After that, the first layout structure is etched with the etching mask to form a second layout structure having a second width. The second width is less than the first width.

This fabricating method is capable of finishing the fabrication of gate structures in two different directions. Accordingly, the layout flexibility is improved.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
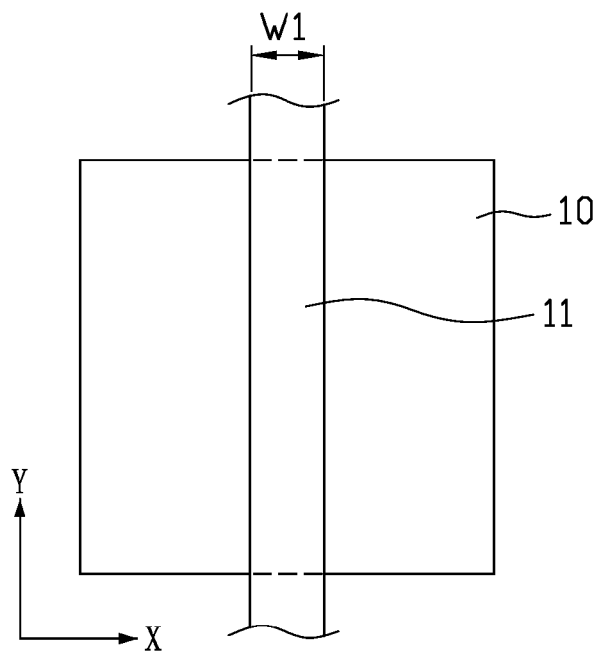
FIGS. 1A and 1B are schematic top views illustrating partial elements in an IC chip.
Figure 1B:
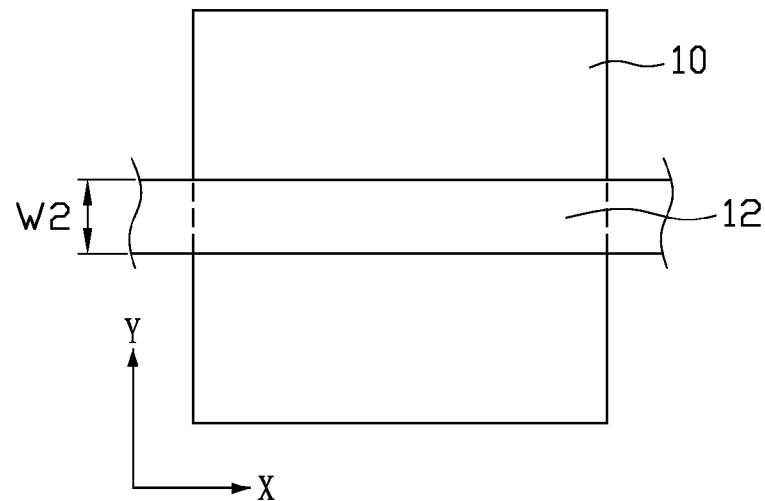
Figure 2:
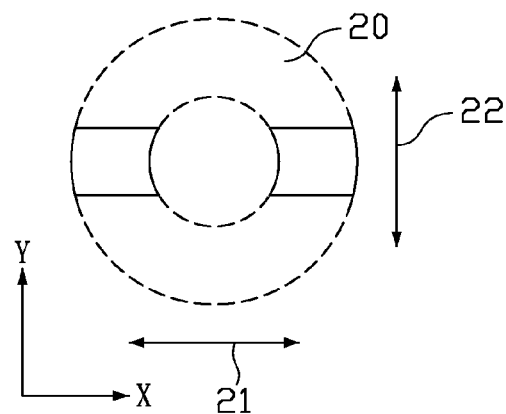
FIG. 2 is a schematic view of light source used in the dipole exposure technique.
Figure 3A:
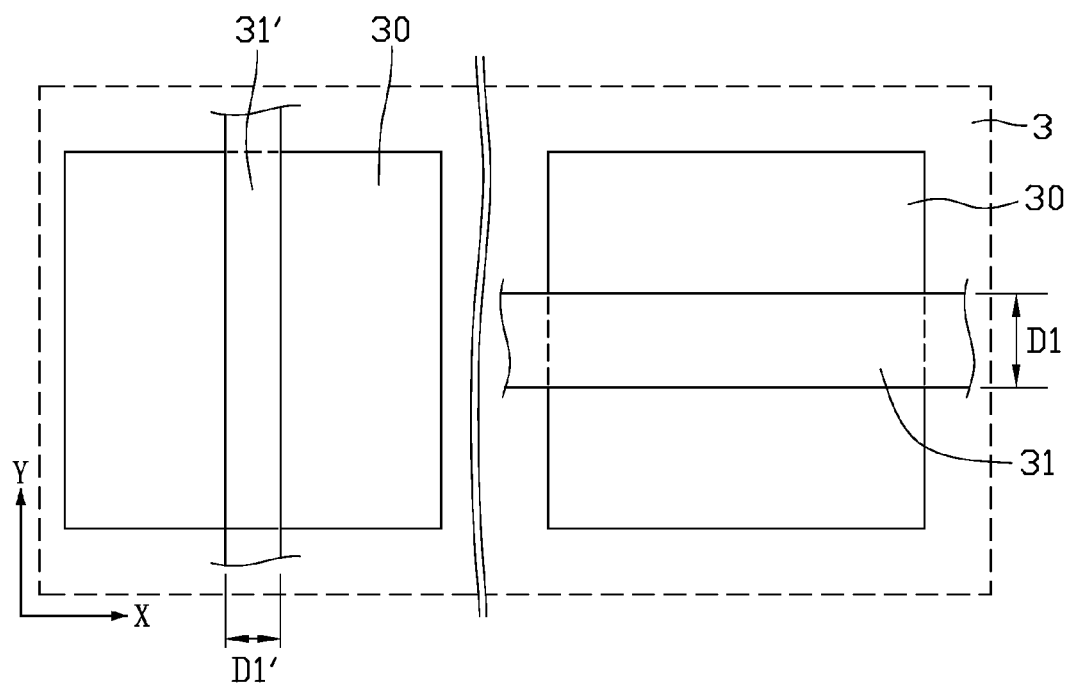
FIGS. 3A to 3C are schematic views illustrating a fabricating method in accordance with an embodiment of the present invention.
Figure 3B:
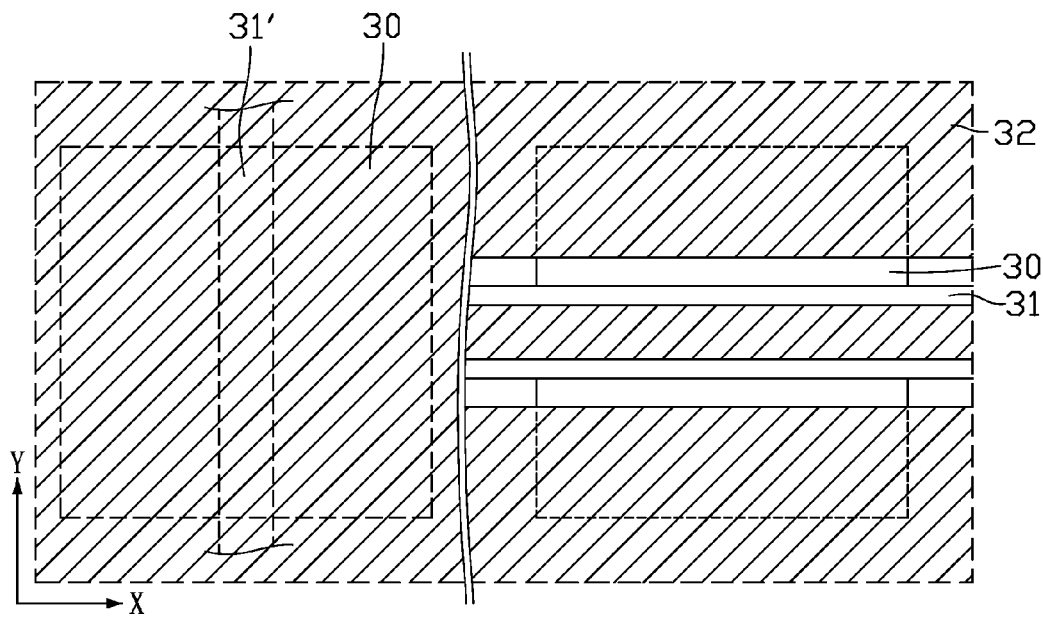
Figure 3C:
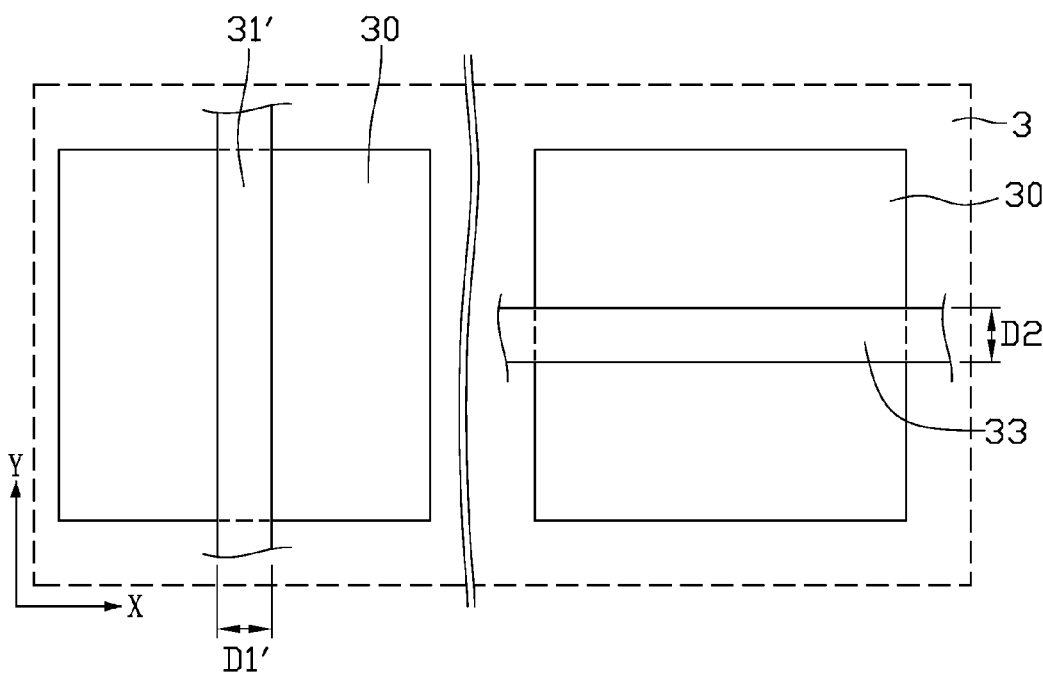

To overcome the disadvantage that the width of gate structures can't be efficiently reduced an embodiment of the present invention provides a fabricating method for a semiconductor element as illustrated in FIGS. 3A to 3C. First, referring to FIG. 3A, a silicon substrate 3 is provided. An active region 30, a first gate structure 31 and a third gate structure 31' are formed on the silicon substrate 3, wherein the active region 30 is surrounded by a shallow trench isolation (STI) structure. The active region 30 includes the source/drain regions and channel region of a MOS element, and a portion of the active region 30 that is cover by the first gate structure 31 is the channel region. The first gate structure 31 has a width of D1. The first gate structure 31 can be formed by the following processes. A polysilicon gate layer (not shown) is formed on the substrate 3 having the active region 30 formed therein, and then a first photoresist layer (not shown) is applied onto the polysilicon gate layer. After that, the photoresist layer is cured and developed to form a photoresist mask (not shown). Gate structures, including the first gate structure 31 and a third gate structure 31', are then formed by etching the polysilicon layer using the photoresist mask to protect wanted portions. The first gate structure 31 and the third gate structure 31' extends in the x-axis direction and the y-axis direction, respectively.

If the first gate structure 31 and the third gate structure 31' are formed by the above dipole exposure technique, and a lengthwise direction (i.e., the y-axis direction) of the third gate structure 31' is parallel to a lengthwise direction of the laser light source used in the dipole exposure technique, as shown in the left part of FIG. 3A, a width D1' of the third gate structure 31' can be reduced to an expected value, for example, 120 nm. However, if an extending direction (i.e., a lengthwise direction or the x-axis direction) of the first gate structure 31 is not parallel to or even orthogonal to an extending direction (i.e., the lengthwise direction or the y-axis direction) of a laser light sourced used in the dipole exposure technique, as shown in the right part of FIG. 3A, the width D1 of the gate structure 31 hardly meets the requirement of smaller CD. To improve the layout design flexibility, the present embodiment employs another lithography process to form an etching mask 32 as shown in FIG. 3B. For example, a second photoresist layer (not shown) is formed to cover the gate structure 31 and the third gate structure 31' on the substrate 3. Then, a second photomask is used to define the second photoresist layer to form the etching mask 32, which exposes a portion of the first gate structure 31. Besides, this lithography process for forming the etching mask, for example, is a conventional exposure method, but not the dipole exposure that suffers from the problem of light attenuation in a certain direction.

After that, an etching process is performed to etch the portion of the first gate structure 31 that is exposed from the etching mask 32 thereby obtaining a second gate structure 33 having a width D2, as shown in FIG. 3C. It is clearly shown that the width D2 is less than the width D1. To break though the resolution limit, a commonly known technique including two photomask and two etching processes (2P2E) are employed in the fabrication of integrated circuits, and the second lithography process of the present embodiment can be integrated with a second photomask and a second etching process of the 2P2E method. Therefore, the fabricating method for a semiconductor element of the present embodiment doesn't introduce additional steps.

In addition, the above described method is not only applicable for the fabrication of gate but also for the fabrication of other layout structures such as active region surrounded by the STI structure.

As discussed above, the present embodiment employing a second photomask and a second etching process without using the dipole exposure method. The light attenuation of dipole exposure is avoided. Thus, the fabricating method of the present embodiment is capable of finishing the fabrication of gate structures in two different directions. Accordingly, the layout flexibility is improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fabricating method of a semiconductor element, comprising:
   proving a substrate;
   forming a first layout structure having a first width on the substrate with a dipole exposure method, wherein a lengthwise direction of the first layout structure is orthogonal to the first width thereof;
   forming an etching mask on the first layout structure, wherein the etching mask exposes a portion of the first layout structure along the lengthwise direction thereof; and
   performing an etching process with the etching mask to form a second layout structure having a second width less than the first width.

2. The fabricating method of a semiconductor element as claimed in claim 1, wherein the substrate is a silicon substrate, the first layout structure is a first polysilicon gate structure, and the second layout structure is a second polysilicon gate structure.

3. The fabricating method of a semiconductor element as claimed in claim 2, wherein the formation of the first polysilicon gate structure comprises:
   forming a first polysilicon gate layer on the substrate, wherein the substrate having an active region formed therein;
   defining the first photoresist layer with a first photomask to form a first photoresist mask; and
   etching the polysilicon gate layer to form the first polysilicon gate structure with the first photoresist mask.

4. The fabricating method of a semiconductor element as claimed in claim 3, wherein the first photoresist layer is defined by the dipole exposure method.

5. The fabricating method of a semiconductor element as claimed in claim 1, wherein the substrate is a silicon substrate, the first layout structure is a first active region, and the second layout structure is a second active region.

6. The fabricating method of a semiconductor element as claimed in claim 5, wherein the formation of the first active region comprises:
   forming a first photoresist layer on the substrate;
   defining the first photoresist layer to form a photoresist mask;
   defining the substrate with the first photoresist mask to form a plurality of shallow trench isolations, wherein the first active region is surrounded by the plurality of shallow trench isolations.

7. The fabricating method of a semiconductor element as claimed in claim 6, wherein the first photoresist layer is defined by the dipole exposure method.

8. The fabricating method of a semiconductor element as claimed in claim 1, wherein the formation of the etching mask comprises:
   forming a second photoresist layer on the substrate to cover the first layout structure; and
   defining the second photoresist layer with a second photomask to form the etching mask.

9. The fabricating method of a semiconductor element as claimed in claim 1, wherein a third layout structure having a third width is simultaneously formed together with the first layout structure on the substrate, and the third layout structure is substantially orthogonal to the first layout structure.

10. The fabricating method of a semiconductor element as claimed in claim 9, wherein the third width is less than the first width.

* * * * *